United States Patent [19]

Lemelson

[11] Patent Number: 5,332,348
[45] Date of Patent: *Jul. 26, 1994

[54] FASTENING DEVICES

[76] Inventor: Jerome H. Lemelson, 868 Tyner Way, Incline Village, Nev. 89450

[*] Notice: The portion of the term of this patent subsequent to Mar. 17, 2009 has been disclaimed.

[21] Appl. No.: 849,155

[22] Filed: Mar. 10, 1992

Related U.S. Application Data

[63] Continuation-in-part of Ser. No. 489,499, Mar. 7, 1990, Pat. No. 5,096,352, which is a continuation-in-part of Ser. No. 32,353, Mar. 31, 1987, Pat. No. 4,949,149.

[51] Int. Cl.$^5$ .................. F16B 37/00; F16B 43/02; B01J 3/06
[52] U.S. Cl. ................... 411/427; 411/157; 411/544; 411/902
[58] Field of Search .............. 411/366, 388, 389, 411, 411/424, 900–903, 908, 914, 157, 427, 544, 428

[56] References Cited

U.S. PATENT DOCUMENTS

| | | | |
|---|---|---|---|
| 3,099,083 | 7/1963 | Delong | 411/902 |
| 3,361,448 | 1/1968 | Warrington | 411/389 |
| 4,005,163 | 1/1977 | Bokros . | |
| 4,214,037 | 7/1980 | Galasso et al. . | |
| 4,554,208 | 11/1985 | MacIver et al. . | |
| 4,663,183 | 5/1987 | Ovshinsky et al. . | |
| 4,802,807 | 2/1989 | Offenburger et al. | 411/902 |
| 4,882,138 | 11/1989 | Pinneo . | |

FOREIGN PATENT DOCUMENTS

| | | |
|---|---|---|
| 2926080 | 1/1981 | Fed. Rep. of Germany . |
| 195094 | 10/1985 | Japan . |

*Primary Examiner*—Neill R. Wilson
*Attorney, Agent, or Firm*—J. Kevin Parker

[57] ABSTRACT

Fastening devices such as washers, seals and drive pins subject to corrosive deterioration of all or select portions thereof wherein all or such select portions are protected from such corrosion and failure by a thin coating or coatings of hard surface material or materials. In a preferred form, the fastening device is coated with a synthetic diamond material formed as a thin layer in situ thereon. In addition to preventing moisture and other corrosive material from penetrating to the base metal, such synthetic diamond material serves to preserve the surface integrity of the fastening device preventing the formation or spread of surface flaws produced during use or during the fabrication of the fastening device.

18 Claims, 3 Drawing Sheets

FASTENING DEVICES

This is a continuation-in-part of application Ser. No. 07/489,499 filed Mar. 7, 1990 now U.S. Pat. No. 5,096,352 which is a continuation-in-part of Ser. No. 07/032,352 filed Mar. 31, 1987 U.S. Pat. No. 4,960,643.

SUMMARY OF THE INVENTION

This invention relates to improvements in fasteners which are totally or partially protected against heat and chemical corrosion as well as surface attrition and, in certain instances, are enhanced in strength by means of a layer of synthetic diamond material deposited in situ thereon. In certain instances, the synthetic diamond material contains a thin plating of chromium or other solid lubricant, which serves to protect same against attrition during use. In certain instances, portions of the fasteners are void of synthetic diamond coating material which portions are protected against corrosion or erosive effects when they engage respective surfaces of work during use.

It is a primary object of this invention to provide new and improved structures in fasteners which are totally or partially coated with hard synthetic diamond material applied thereto as carbon atoms deposited from a carbon atom containing gas or gas mixture located adjacent the surface or surfaces of the fasteners, when radiation, such as microwave radiation, is beamed through the gas or gas mixture against the fastener surfaces causing the carbon atoms to deposit as a thin coating or film thereon and to become bonded as a hard diamond layer against the surfaces so coated.

Another object is to provide fasteners of the threaded type wherein the threads of the fastener are protected against corrosion and erosion during use by means of a hard diamond or diamond-like material coating same.

Another object is to provide new and improved fasteners, a select portion or portions of which are coated with a hard thin diamond layer operable to protect same against corrosion and erosion and, in certain instances, to enhance the strength of such fasteners.

Another object is to provide new and improved structures in threads of threaded members employed to effect assemblies and in machine operation, which threads or threaded members contain a thin film of synthetic diamond material and an overcoating of chromium to protect same, wherein the combination of the diamond material and the chromium greatly enhance the life of the threaded elements.

Another object is to provide a new and improved threaded fastener wherein the threads thereof are enhanced in strength by a coating of synthetic diamond material.

Another object is to provide improvements in threaded fasteners wherein the threads thereof are protected against surface failure and destruction due to the extension of surface cracks and the like.

Another object is to provide improvements in threaded fasteners wherein the threads thereof will not bind, rust or otherwise degrade during long use.

Another object is to provide new and improved machine screws, nuts and bolts having superior physical characteristics.

With the above and such other objects in view as may hereinafter more fully appear, the invention consists of the novel structures, article constructions and methods described in the following specification and illustrated in the drawings, but it is to be understood that variations and modifications may be resorted to which fall within the scope of the invention as claimed without departing from the nature and spirit of the invention.

BRIEF DESCRIPTION OF THE DRAWINGS

In FIG. 1 is shown a fastener 10 in the form of a machine screw or bolt which is formed by machining, forging or molding a suitable metal, high strength plastic or ceramic material. The fastener 10 is formed with a hexagonally shaped head portion 11 extending to an elongated shank portion 15 having a smooth cylindrical portion 16 next to the head 11. The remaining portion 17 of the shank 15 is formed with a helical thread 18 machined, rolled or molded therein, to be turned and threaded into a threaded hole in a work piece, nut or other auxiliary member cooperating therewith in fastening work or work elements together. The head 11 contains a flat upper surface 12 and a flat undersurface 13, although it may have any suitable shape, such a rounded head 11A with a slot 14 for a screwdriver to turn the fastener as shown in FIG. 2.

In FIG. 2 the slotted cavity 14 extends partly across the head 11A to receive a conventional screw driver blade or the like for tightening or removing the fastener from a work piece. The cavity 14 is shown open at its end although it may also be closed and shaped to receive and conform to the end of a wrench, such as an Allen wrench or Phillips head screw driver. The flat undersurface 13A of the head may also be shaped to effect a thread locking action when tightened against a work surface or such action may be effected by properly shaping the endmost of the threads.

Respective surface portions of the fastener 10 include the folded upper surface 12A of the head 12, the cylindrical outer surface 15A of the upper portion of the shank 15, the side walls 18A of the helical thread formation 18 and the surface 15B of the end of the shank 15.

Figure 1:
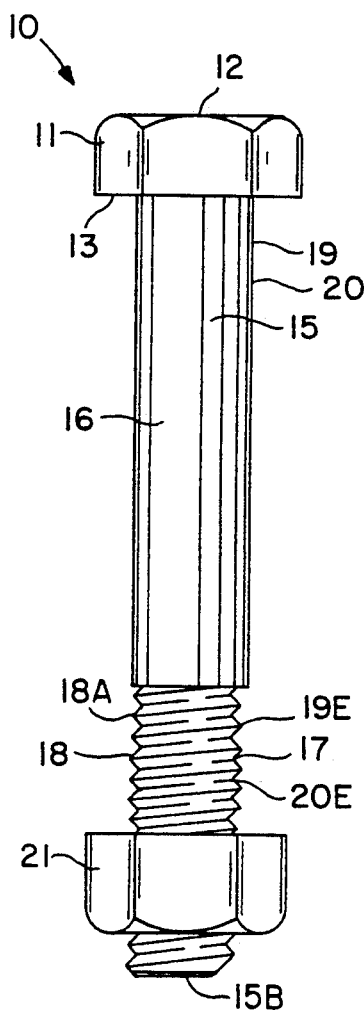
FIG. 1 is a side view of a threaded fastener embodying features of the invention.

The fastener 10 of FIG. 1 may have all or select portions of its surface coated with a thin fib or layer 19 of hard, synthetic diamond material formed in situ thereon by deposition, such as by passing intense radiation such as microwave radiation, through a suitable gas or fluid containing atoms of carbon, in such a manner as to cause such carbon atoms to become deposited as a thin layer of hard synthetic diamond or diamond-like material against said outer surface, preferably although not necessarily as defined in my U.S. Pat. No. 4,859,493.

Notation 19A refers to that portion of the diamond material coating the upper rounded surface 12A of the head 11A; notation 19B to that portion of the diamond coating disposed against the flat bottom surface 13A of the head 11A notation 19C to that portion of the diamond coating disposed against the side and bottom walls of the slotted cavity 14; notation 19D to that portion of the diamond coating disposed against the cylindrical upper surface of the shank 15; notation 19E to that portion of the diamond coating disposed against the surfaces of the thread or threaded formation extending helically around the lower portion of the shank 15 and notation 19F to that portion of the diamond coating disposed against the end of the shank 19.

Depending on the intended application or applications of the fastener 10, the thin coating of synthetic diamond material may be disposed against any of the described surface portions of the fastener or any combination thereof to the exclusion of one or more of the other surface portions thereof. For example, the spiral surfaces of the threads 17 of the fastener may contain such synthetic diamond material coating or film to the exclusion of the other portions of the fastener, for protecting same against chemical corrosion, wear, spalling or stress crack failure caused when a microcrack or cracks in the surface stratum of the material thereof expands without restraint due to tensile and/or compressive forces applied to the fastener through the threads thereof. Such coating may also be applied to the exposed upper surface 12 of the head including the surfaces of the cavity 14 and/or to the bottom surface 13 of the head to protect same against corrosion and the extension of surface defects.

For certain fastener applications it may be desireable to protect the outer surface of the diamond film from erosion. Accordingly, a thin layer 20 of protective metal, alloy, oxide, nitride or carbide of such metals as chromium, vanadium, aluminum, titanium, molybdenum or other metal may be plated or vapor deposited against the outer surface of the diamond coating 19.

Figure 2:
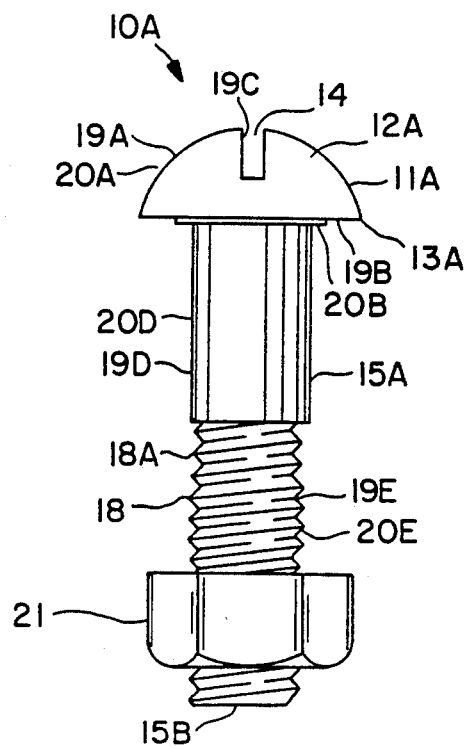
FIG. 2 is a side cross sectional view of a nut embodying features of the invention.
Figure 3:
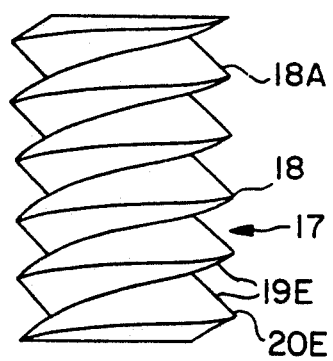
FIG. 3 is a side cross sectional view of a portion of the structures of the fasteners of FIGS. 1 and 2.

The fasteners of FIGS. 1 and 2 may also contain one or more washers or locking devices secured beneath the head 11 or to the threaded portion thereof. Such locking device of devices may contain a hard synthetic diamond material formed thereon by the deposition of carbon atoms from carbon atom containing molecules, such as methane gas through which high energy radiation, such as microwave radiation, is passed to the surface or surfaces of the fastener.

Figure 4:
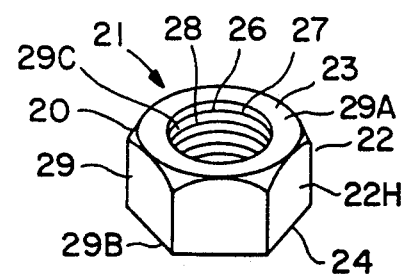
FIG. 4 is an isometric view of a hexagonal nut which is completely or partly coated with a synthetic diamond material.

In FIG. 4 is shown a machined, forged or molded fastener component 21, such as a hexagonal or otherwise shaped nut formed of metal, plastic or ceramic material defining a solid body 22 having parallel upper and lower flat surfaces 23 and 24 and a hexagonally shaped flat faceted side wall 22H. Extending through the center of the body 22 is a cavity or passageway 26, the side wall 27 of which is formed with an internal helical thread formation 28 which may be molded, roller or machined therein. Coating the entire exposed surface of the nut body 22 including the surfaces 23 and 24; and the threaded interior surface of the passageway 26, is a thin film of synthetic diamond or diamond-like material 29. Notations 29A to 29C refer respective to those portions of the thin diamond coating 27 which cover the faces 23 and 24, the side wall 22H and the surfaces of the hole or thread formation defining the inside surface of the wall of the hole.

The coatings 19 and 20 of FIGS. 1 and 2 may cover select portions of the fastener and nut or the entire exposed surfaces thereof and may be applied by means described in U.S. Pat. No. 4,859,493 in thicknesses which may vary from a few millionths of an inch to a thousandth of an inch or more depending on the corrosive and erosive atmospheres to which the fasteners are to be subjected during use as well as the forces expected to be applied to such fastener. Since the diamond film also serves as an electrical insulator, the corrosive effects experienced by electro-chemical attack, may be reduced substantially by the use of such coating or film of synthetic diamond material Thicker films in the older of 0.001" to 0.001" may be provided to substantially enhance the strength and resistance to tensile and vibrational failure caused when microcracks formed in the outer stratum of the fastener material during machining or otherwise forming same expand as a result of forces applied to the fastener during use. Such diamond film may also serve to increase the tensile strength and resistance to corrosion, particularly of the threaded portion of the fastener.

Figure 5:
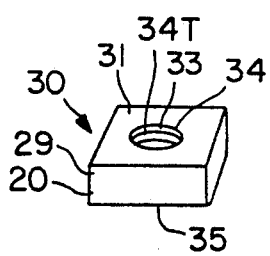
FIG. 5 is an isometric view of a square nut which is completely or partly coated with synthetic diamond material.

FIG. 5 shows a square nut 30 having a rectangular shape with a flat top wall 31 and a flat bottom wall 35 and four flat wall portions 32. A cylindrical hole 33 is centrally drilled between surfaces 31 and 35 and a thread is formed in its sidewall 34. Coating the entire surface of the nut including the thread formation 34T is a synthetic diamond material which may be deposited and bonded to the surfaces of the nut as set forth in my copending application Ser. No. 032,352.

Figure 6:
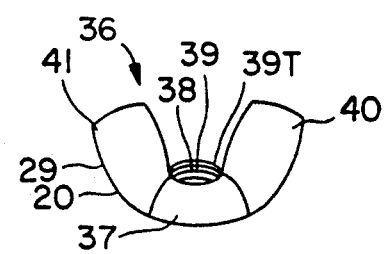
FIG. 6 is an isometric view of a wing nut which is completely or partly coated with synthetic diamond material.

In FIG. 6 is illustrated a wing-nut 36 having a central body portion 37 with a cylindrically shaped hole 38, the wall 39 of which contains a helical thread formation 39T. Tabs or ears 40 and 41 are integrally cast with the central body portion and serve as finger gripping means for turning the nut. The entire outer and treaded surfaces of the fastener 36 are coated with a synthetic diamond material as described which serves to protect it from corrosion and failure due primarily to the extension of surface defects and corrosion.

In modified forms of the invention illustrated in FIGS. 1 and 2, only a select portion or portions of the fasteners illustrated may be coated with diamond film to protect same against wear, corrosion and the effects of surface irregularities such as cracks, during the production thereof, which would normally cause failure of the fastener when subjected to high stress and vibrational forces during use. For example, the threads 18 of the machine screw or bolt 10 of FIG. 1 and the threads 26 of the nut 20 of FIG. 2 may be coated with synthetic diamond film to the exclusion of other portions of the fastener, to protect same from chemical corrosion and physical destruction, which diamond film may be overcoated or plated with a thin layer of chromium serving to protect the surface of the diamond film. The entire surface of the fastener 20 with the exception of the undersurface 13 of the head or an anular portion [not shown] thereof may be coated with such diamond film and chromium materials in a coating process in which such surface 13 or an anular portion thereof near the shank rests against a retaining surface by gravity or is gripped by the retaining device during the process in which such synthetic diamond film is deposited in a reaction chamber containing methane gas, for example, into which microwave energy is beamed. Similarly, the bottom surface 24 of the nut 20, or an anular portion thereof, which engages the work against which the nut is drawn, may be void of synthetic diamond material as a result of engagement thereof against the surface of a retaining means during a coating operation.

Such portions of the fasteners 10 and 20 which are not coated with diamond material, may be chromium plated in an operation in which the fasteners are tumbled in a plating drum or barrel after application of the synthetic diamond film thereto. It is noted that the annular portion of such fasteners which are not coated with synthetic diamond material may be protected against corrosion when it engages the work surface as the fastener is tightened thereagainst. Such annular portion may be immediately adjacent the shank or threaded hole or outwardly therefrom.

A variety of other fasteners may be similarly coated with synthetic diamond material and chromium or other suitable solid lubricant to increase the strength thereof, protect the surfaces of such fasteners against surface failure during use, protect the fastener materials against chemical and heat corrosion as well as physical attrition and, in certain as instances, insulate the fasteners electrically. Such fasteners jam and castellated nuts, lock nuts, pins, rivets, threadless shear bolts or the like may be similarly coated and plated with synthetic diamond and chromium materials to greatly improve their physical and chemical characteristics and prevent failure during use. Nails, drive pins, and other piercing devices which are subject to surface attrition and failure during application and use may also be similarly coated with synthetic diamond material with or without a protective solid film or layer of chromium or other material applied to the surface of the synthetic diamond material. Similarly fastening devices such as lock washers and metal seals applied to fasteners and other mechanical assemblies may also be similar single or double coated to protect same against corrosion, erosion during application and use and the extension of surface defects caused by heavy loading and impact forces. Fasteners which are welded or brazed to assemblies or components may also be similarly-single or double coated with synthetic diamond material and chromium or the like as may the welds therefore which may be so coated after welding is complete or during the welding operation to protect same from corrosion, the formation and extension of surface cracks during the application of force and impacts to the fastened components.

The coatings of synthetic hard diamond or diamond-like material applied to the entire articles or select portions of such articles subjected to frictional wear, weathering, temperature or chemical corrosive effects, and destruction caused by the expansion of surface defects such as surface cracks formed during fabrication, may be formed of carbon atoms deposited thereon from gas, vapor or liquid molecules containing such carbon atoms, as a result of passing high intensity radiation, such as microwave radiation or the like, through such carbon atom containing fluids, by means shown and described in my parent application Ser. No. 32,307, now U.S. Pat. No. 4,859,493, in thicknesses which may vary from a few millionths of an inch to a thousandth of an inch or more depending on the expected use of the articles or assemblies including the corrosive and erosive atmosphere to which they are subjected. Thicker films in the order of 0.0001" to 0.001" or more may be provided to substantially enhance the tensile and compressive strengths of the articles or components. Where the article or component is subjected to movement and abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the substrate or select portion of the outer surface thereof. Such chromium may also be deposited as chromium atoms present in the gas, vapor or liquid disposed adjacent the surface of the article, while carbon atoms are deposited or sequentially after the deposition of carbon atoms to provide either a composite layer of carbon and chromium atoms or one or more layers of carbon atoms interposed between one or more layers of chromium atoms or coatings thereof.

Figure 7:
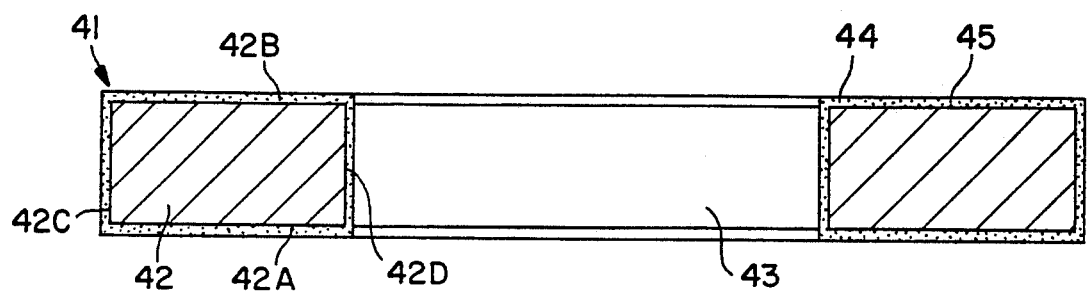
FIG. 7 is a cross sectional view taken along a diameter of an annular washer having a composite structure formed of metal and a synthetic diamond material.

In FIG. 7 is shown a flat washer 41 for use between two components of a mechanical assembly such as between a bolt head or a nut and a work member or members to be fastened together therewith. The washer 41 is formed of an annular disc 42 made of metal or ceramic. One or more hard protective coatings completely cover all surfaces of the washer 41 including opposite flat annular surfaces 42A and 42B, the circular outside peripheral surface 42C and the cylindrical circular inside wall 42D thereof. A base coating 44 is formed in situ on all surfaces of carbon atoms deposited from molecules of a hydrocarbon gas or vapor utilizing high intensity microwave radiation or the like as described to strip the carbon atoms from the molecules, bond them to the surfaces of the washer or a thin coating thereon and form a high strength corrosion resistant diamond-like or synthetic diamond coating thereon in the range of thicknesses described above. A second coating 45 of chromium or one of the other overcoating materials described is shown deposited or formed against surfaces 42A to 42D. Either the synthetic diamond coating or both coatings serve to protect the material of the disc 42 from corrosion and mechanical failure as described.

The mechanical washer 41 of FIG. 7 may be subject to a number of shape variations such as one in which the base 42 is a shape other than flat, has straight or twisted finger-like radial lips or is split to permit it to serve as a lock washer, wherein all exposed surfaces of such configurations are coated with the described synthetic diamond coating with or without the described overcoating.

While the central opening 43 in the washer or seal 41 is shown as circular in shape, it may be irregularly shaped by irregularly shaping the inside wall 42D of the annular of the disc 42 to permit the washer to serve as a lock washer, a threaded washer or nut or a locking seal. The base 42 which may vary in thickness from several thousandths of an inch where the washer may be used as a shim a seal to a quarter of an inch or greater, may be arcuately stamped or otherwise formed to provide it cup-like in shape to permit it to act as a spring and to impart a thread locking action to a screw or bolt, the head of which may compress and deform the washer against a work surface below its elastic limit.

Figure 8:
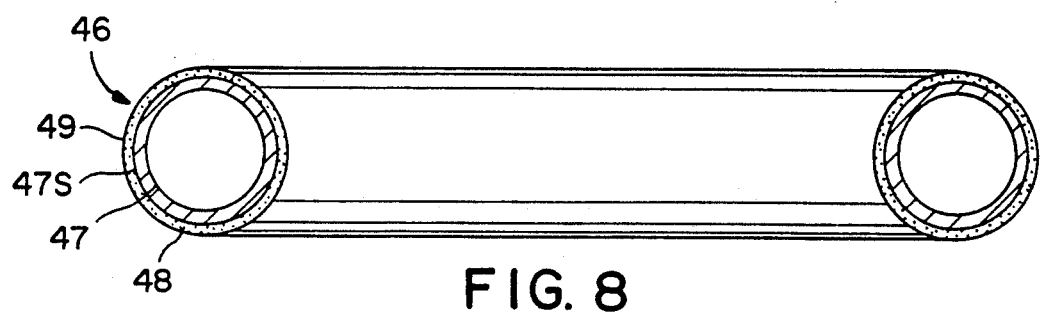
FIG. 8 is a cross sectional view taken along a diameter of a metal O-ring having its outer surface coated completely with a synthetic diamond material.

In FIG. 8 is shown an O-ring 46 formed of a tubular torroidally shaped metal core 47, the entire outer surface of which is coated with a synthetic diamond material formed in situ thereon by one or more processes as described above. In a preferred form the core 47 and synthetic diamond coating 48 form a composite walled ring which is compressible to some degree and deformable between two members such as a fastener and work or two work members so as to provide both sealing and locking functions between the two assembled members. In other words, for the amount of compressive deformation effect upon assembly of the components between which the metal-diamond O-ring is compressively assembled, the diamond coating or film 48 is of such thickness that it will not crack or develope surface cracks, yet will serve to protect the core ring 47 and the entire outer surface 47S thereof from corrosion and the erosive effects of high temperature, vibrations and shocks during use. The thickness of the diamond coating 48 to provide such protection and crack resistance will vary, as described, depending on the dimensions of the O-ring, the compressive force applied thereto upon assembly and other parameters of use such as sealing pressure, temperature and vibrations experienced during use. An overcoating 49 of one or more of the metals or alloys described above, is bonded to and completely surrounds the synythetic diamond coating 48. Such overcoating serves as a solid lubricant and corrosion resistant covering for the synthetic diamond coating 48 which completely surrounds and is bonded to the outer surface 47S of the torroidal hollow core 47.

In other forms of the invention illustrated in FIG. 8, it is noted that the core member 47 may be solid metal, ceramic or plastic and may have a cross sectional shape other than circular as illustrated. For example, such ring core may be shaped with one or more deflectable or deformable lip-like protrusions which deform upon compression of the circular seal between surfaces to provide a contant restoring force. As in the embodiment shown in FIG. 8, such structure may include a synthetic diamond coating completely surrounding and covering all surfaces of the irregularly shaped circular sealing ring to completely seal in the core material.

Figure 9:
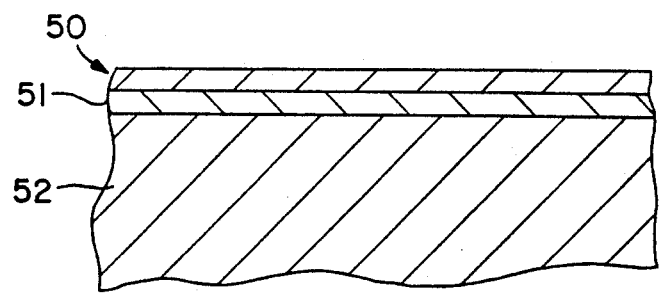
FIG. 9 is a sectioned view of a fragment of a structure of an article of manufacture coated with a synthetic diamond material and having an overcoating of a metal.
Figure 10:
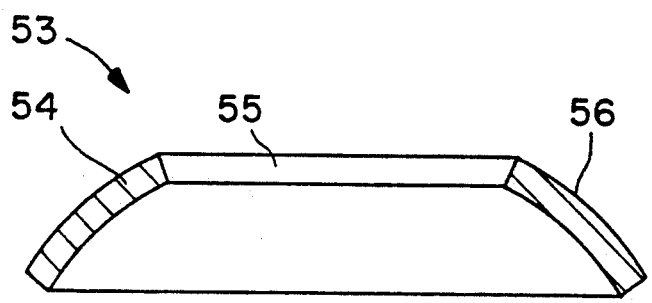
In FIG. 10 is shown a washer 53 formed of a circular shaped ring 54 of metal wherein the wall of the ring is arcuately formed to permit the washer to serve as a lock washer or seal when it is compressed between two surfaces. The entire outer surface of the washer has a thin coating 56 of synthetic diamond or diamond-like material formed thereon as described above.
Figure 11:
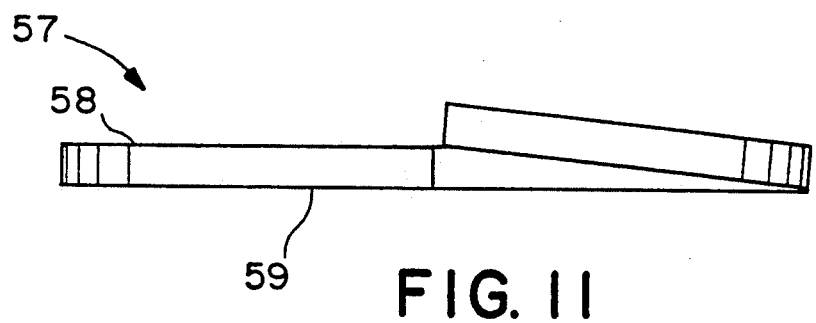
FIG. 11 illustrates a locking washer 57 in the shape of a split ring 58 having respective end portions of the split ring formed apart from each other to permit the washer to be used as a lock washer between two surfaces on as the head of a screw or bolt and work against which the screw is engaged. The entire outer surface of the washer 57 is coated with a hard synthetic diamond or diamond-like material denoted 59.

In FIG. 9 is shown structural details of the synthetic diamond coatings, the protective overcoatings and the substrates coated. The substrate, which may be any of the configurations hereinabove described, is denoted 50 and is made of suitable metal, metal alloy, ceremet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitable hydrogen gas mixed therewith to provide suitably efficient deposition and synthetic diamond layer formation to the desired thickness which may vary in the range of 0.000001" to 0.010" and, for most applications in the range of a few millions of an inch to a few thousandths of an inch. The overcoating 52 of chromium is shown completely covering the synthetic diamond coating 51 and may be applied by electroless or electrical deposition, vapor deposition, detonation or plasma plating. Thickness of depths of such overcoating may range from 0.0001 to several thousands of an inch or more and preferably in the range of a few thousands of an inch or less.

The substrate 52 of FIG. 2 may also be made of a number of materials other than metal, metal alloys or ceramic material as described. For certain applications involving the structures described it may be made of mixtures of ceramic or metal powder or a combination of both per se of mixed with short synthetic diamond filaments or particles shaped, dimensioned and produced as set forth in my copending patent application Ser. No. 032,352 filed Mar. 31, 1987 providing a rigid matrix which is reinforced by such particles and, in certain applications, tailored in chemical and electrical characteristics to perform select functions as a high strength insulating, semiconducting or conducting material or as a heat conducting or insulating material, the surface or surfaces of which are protected from corrosion, erosion and frictional wear and failure due to forces applied thereto during operational use by either or both the coatings 50 and 51.

FIG. 9 may also represent a portion of a flexible substrate 52 made of a plastic resin such as a suitable polymer or copolymer; random or aligned fibers such as paper made from woodpulp or other material or woven material such as a cloth, canvas or reinforcement for a composite material such as carbon-carbon having either or both major surfaces thereof coated with synthetic diamond material formed in situ thereon by chemical vapor deposition utilizing microwave energy to strip carbon atoms from molecules of a hydrocarbon liquid or gas such as methane by means such as described above and in my copending application Ser. No. o32,352 and U.S. Pat. No. 4,859,493.

In a particular embodiment of the structure of FIG. 2 the substrate 52 may comprise a sheet of fibrous material such as paper or paperboard, canvas or the like having either or both the major surfaces thereof coated with a thin film of synthetic diamond material and having a valuable painting or print of art rendered on one of the surfaces thereof. The following forms of the invention are noted:

1. In a first form of the invention, the substrate 52 is a sheet of flexible or rigid fibrous material, such as paper or paperboard, canvas or the like containing printing material such as printing ink or painting material such as paint in the form of painting oils, acrylic or other material represented by the layer 51 which may or may not be absorbed into the surface stratum of substrate 51 as in most painted works of art. Layer 50 which is formed in situ and deposited on the outer surface of paint layer 51 or directly against the outer surface of substrate 52 is a thin film of synthetic diamond material which serves to protect the painting and the substrate from degradation due to atmospheric chemicals. The synthetic diamond material may be deposited as a thin transparent film in the range of thicknesses between 0.000001" to 0.0001" and is preferably ,although not necessarily less than about 0.00001" in thickness. While the synthetic diamond film may be utilized per se to protect the outer surface of the painting from chemical attack and to prevent cracking of the paint as it ages, it may also be overcoated with a thin coating of a plastic resin such as a suitable polymer or copolymer which may be utilized to protect the outer surface of the diamond film from abrasion and reduce its possibility of failure therein such as cracking during handling or mounting same of a support. If fine voids or pin holes occur in such synthetic diamond film during its formation, such plastic film or coating may be employed to fill or cover such voids and strength and flexibility to the laminate without adversely affecting the painting or print. However, the synthetic diamond film may be utilized per se to protect substantially the entire painting or print from chemical degradation, particularly if such print or painting is supported in a frame behind a sheet of glass or rigid plastic.

2. In a second form of the invention a laminate is first formed of a sheet substrate 52 made of fibrous material such as paper, paperboard, canvas or the like and has one of its major surfaces 52S on which printed matter or a painting of value is to be made by an artist, coated with a thin layer or film 51 of synthetic diamond material formed in situ thereon as described by stripping carbon atoms from carbon atom containing molecules with microwave energy as described. The painting or print is then applied to the outer surface of the diamond film which may vary in thickness from a few millionths of an inch to a thousandth of an inch or more. A thin coating of clear or white colored plastic resin may be automatically applied to the outer surface of the diamond film onto the outer surface of which plastic may be printed or hand painted artwork or the like. The diamond film serves as a barrier against moisture and chemicals which may be present in or pass through the paper or paperboard substrate. After the painting or printed matter is completely applied to the outer surface of the first layer of synthetic diamond or a subsequent layer of plastic resin thereon, a second layer of synthetic diamond material is formed in situ against the outer surface of the painting or print completely covering all the printed matter or paint and exposed plastic of first layer of synthetic diamond laminating the paint or printed matter and hermetically sealing same therebetween.

3. In a third form of the invention a thin layer or film of synthetic diamond material is applied as described to the back of a sheet of paper, canvas or other suitable material either prior to or after printed matter or a painting has been formed on on the opposite surface thereof. Once the printed matter or paint forming a work of art has been so applied to the other surface of the sheet, a thin coating of synthetic diamond material is applied thereover including any exposed surface portion(s) of the sheet not printed or painted on. In other words, the entire other surface of the print or painting is coated with synthetic diamond material as described. The coating on the back side of the sheet seals the sheet itself from the atmosphere and moisture therein as well as any pollutants preventing same from adversely affecting both the sheet or paper and the printed matter or paint on the other surface thereof. The synthetic diamond coating on the front face of the painting or print seals such surface and hermetically seals the painting, print and paper or canvas between itself and the synthetic diamond material coating the opposite side thereof. The outer surface of the thin layer of synthetic diamond material, which may be applied in the range of thicknesses described above to the outer surface of the painting or print may remain diamond film or may be overcoated with a thin layer of transparent plastic as described above to enhance the strength of the laminate and protect the diamond film. Such plastic layer may be a preformed sheet of clear plastic flim such as a polyester resin, polycarbonate, polyamide or Nylon, etc.

in the print or painting preservation structures and techniques described above, synthetic diamond film and/or clear plastic film may be applied to the four edges of the paper or canvas sheet to coat or impregnate same in a manner to seal same from moisture and atmospheric gases to prevent same from penetrating the laminate from the edges thereof. Tightly clamping the print or painting betwen a glass sheet and a backing sheet may serve the same purpose and may be used to preserve the print or painting for an extremely long period of time. Painting or printing on diamond film applied to a face of a sheet material will not only protect the paint or ink from interacting with chemicals in the paper or base sheet or with chemicals and moisture penetrating said sheet from the rear, but will also strengthen such sheet material and limit or prevent its stretching to the determent of the painting or print applied thereto.

4. In a fourth form of the invention, a laminate of a print or painting and one or more sheets of plastic and/or glass sheet may have its entire outer surfaces coated with synthetic diamond material as described, thereby sealing such laminate in synthetic diamond material against moisture and atomspheric molecule penetration. If the laminate or a portion thereof is made of a porous material containing atmospheric molecules accessible to the surface(s) of the laminate, it may be placed in a chamber which may be evacuated of air just prior to application of the synthetic diamond coating which may be formed of atoms of carbon stripped from molecules of a hydrocarbon gas controllably fed into the vacuum chamber along with suitable hydrogen to the exclusion of contaminants such as air or other molecules until the coating process is complete.

A number of techniques and apparatus maye be employed to coat paintsings, prints and the like with synthetic diamond. In one, a waveguide for suitable microwave energy is automatically driven in controlled scanning movement across a surface of the painting, print or sheet while methane or other suitable hydrocarbon gas is flowed into the guide against the surface of the painting and suitable-microwave energy is generated and passed through the guide to cause carbon atoms of the gas to be stripped from the gas molecules and deposited onto the surface of the painting or paper until predetermined coating is completed. In a second technique, the painting, print or its laminate as described above is placed and either held stationary or contollably moved in a coating chamber into which hydrocarbon gas (such as methane) is controllably flowed while suitable microwave energy is generated and directed against all or a selected location of the painting. In a third form, the microwave energy generator is moved or controlled to cause microwave energy to scan the sheet causing the scanning deposition of carbon atoms as synthetic diamond film on incremental portions of the painting or sheet. In a forth arrangement, the sheet, painting or print is rolled into a loose coil formation with suitable spacing between surface portions to allow methane gas or the like to be flowed through such spacing while microwave energy is directed against the coil formation to deposit carbon atoms as a film of synthetic diamond material of select thickness, The substrate 52 may comprise a variety of natural or synthetic flexible materials such as paper, plastic sheet or film, parchment, canvas, leather, woven fabrics metal foils, laminates of such materials or such sheet materials coated with a suitable plastic layer or film against the outer surface of which the synthetic plastic material may be deposited as a thin film. Such laminates of flexible substrate sheet, and a plurality of coatings thereon including a first layer of plastic if needed to render the surface of the substrate non-porous, a layer of synthetic diamond material on the surface of the substrate or plastic coating thereon and an overcoating of flexible colored or transparent plastic or preformed plastic film, may be utilized to provide flexible material for a variety of products in which the synthetic diamond coating addes substantially to the strength and abrasion resistance. If the overcoating of plastic is omitted, the synthetic diamond layer itself may serve to offer great resistance to wear and scuffing or abrasion, add to the total strength of the flexible laminate and, in certain applications, serve as a heat insulating layer.

In a modified form of the invention, it is noted that filaments of electrical resistance material, such as tungsten filaments and the like employed in incandescent lamps, may be formed of such material coated with a synthetic diamond material having an overcoating of chromium or the like, as described so as to greatly enhance the life of such filaments and increase the timed failure caused, for example, by the expansion and contraction of the material when the lamp is energized and de-energized. A tungsten filament for a conventional light bulb may be coated with synthetic diamond film per se along its entire length to a thickness in the range of 0.00001" to 0.001" depending on its size and the application parameters thereof. Similarly, the base or support fur such filament, if not glass, may be coated with diamond film of similar thickness as may any fastening or operational devices attached to the filament within the lamp enclosure.

The terminals of incandescent lamps, lamp sockets and connectors may be similarly coated with thin diamond film material to protect same against moisture and chemical corrosion as well as erosion due to arcing or current discharge.

Electrodes employed in other forms of lamps, radiation emitting devices, cathode ray tubes, fuel cells and batteries may be similarly coated with thin film synthetic diamond material varying from 0.00001" to 0.001" depending on the voltage and amperage ranges applied thereto and other operating parameters.

Also shown in FIG. 1 is a sealing ring or washer 22 disposed between the threaded lower end 15 and a stepped portion of the metal shell 12 to provide a pressure seal between the plug and the combustion chamber. Such sealing ring may be made of solid metal, such as copper or formed metal sheet or tube and may be coated with a thin layer, as described, of synthetic diamond material applied thereto per se or having an overcoating of a protective metal such as chromium or other metal as described to strengthen, protect and insulate the sealing ring.

The coatings of synthetic hard diamond or diamond-like material applied to the entire articles or select portions of such articles subjected to frictional wear, weathering, temperature or chemical corrosive effects, and destruction caused by the expansion of surface defects such as surface cracks formed during fabrication, may be formed of carbon atoms deposited thereon from gas, vapor or liquid molecules containing such carbon atoms, as a result of passing high intensity radiation, such as microwave radiation or the like, through such carbon atom containing fluids, by means shown and described in my parent application Ser. No. 32,307, now U.S. Pat. No. 4,859,493 in thicknesses which may vary from a few millionths of an inch to a thousandth of an inch or more depending on the expected use of the articles or assemblies including the corrosive and erosive atmosphere to which they are subjected. Thicker films in the order of 0.0001" to 0.001" or more may be provided to substantially enhance the tensile and compressive strengths of the articles or components. Where the article or component is subjected to movement and abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the subsetrate or select portion of the outer surface thereof. Such chromium may also be deposited as chromium atoms present in the gas, vapor or liquid disposed adjacent the surface of the article, while carbon atoms are deposited or sequentially after the deposition of carbon atoms to provide either a composite layer of carbon and chromium atoms or one or wore layers of carbon atoms interposed between one or more layers of chromium atoms or coatings thereof.

Certain modifications to the structures and methods for making same may be found in my parent application Ser. No. 32,307, now U.S. Pat. No. 4,859,493 and in pending patent application Ser. No. 032,352 filed Mar. 31, 1987, reference being made directly thereto as part of the instant disclosure . Further modifications are noted as follows:

1. Scanning a select portion or portions of the surface or surfaces of the articles described and illustrated in the drawings with one or more radiation beams of laser and/or electron radiation may be effected to provide such coating or coatings on a select area or areas of the outer suface or surfaces of the articles to the exclusion of another area or areas thereof for functional and/or economic purposes. Such an electon beam or laser beam may be employed in combination with microwave radiation and passed through a carbon atom containing gas, such as methane, surrounding all or part of the article or assembly to be coated, and employed to effect or increase the rate of deposition of carbon atoms to form the synthetic diamond coating and/or to heat the substrate to bond the deposited material(s) to the substrate.

2. Such functions as the operation of the radiation beam generating means, the intensity and frequency thereof, if varied, the direction and focus thereof, the flow and replenishment of carbon atom containing gas and hydrogen gas to the reaction chamber and, if employed, flow thereof as one or more streams within such chamber to the vicinity of the surface(s) being coated, the movement and/or prepositioning of the article or material being coated to, within and from the reaction chamber and the flow of any additional material, to be combined with the carbon atoms in the coating, to the reaction chamber and surface of the article(s) being coated, may all be automatically controlled by a computer with or without the generation of feedback signals generated by one or more sensors of such variables as deposited coating thickness, rate of deposition, temperature, beam position, article position, etc.

3. Synthetic diamond coatings as described may be overcoated with protective coatings of chromium, alloys containing chromium, metal alloys containing such metal atoms as vanadium, tungsten, titanium, molybdenum and/or such metals per se, which serve to protect and/or lubricate the surface of the synthetic diamond coatings to resist frictional wear and abrasion during operation and use of the coated article. In certain applications, the synthetic diamond coating will serve to electrically insulate the article. In others, it will protect the surface coated therewith from heat and/or chemical corrosion. In others, the surface(s) coatings will impart greater resistance to wear and abrasion. Surface attrition due to impact forces and loading during use may also be lessened or eliminated by such hard synthetic diamond coating(s) which may be applied as a single or plurality of layers per se or combined or overcoated with one or more layers of the described metals and/or metal alloys to lubicate and protect the surface of the synthetic diamond coating.

4. Coatings formed of a plurality of layers of synthetic diamond material formed as described between respective layers of the same or different metals, metal alloys and/or ceraimic materials may be employed to enhance the physical, chemical resistance and electrical characteristics of the articles described. Such multiple coatings may also be employed to substantially enhance the strength and stiffness of the articles.

5. Fasteners and fastening components of the types illustrated in the drawings and described above may also be made substantially of synthetic diamond material by forming same of particles of synthetic diamond sintered in a die with a plastic or metal binder or mixed with powdered or molten metal and shaped in a die or mold. Such synthetic diamond particles may be made by the means disclosed in my U.S. Pat. No. 4,859,493 and held together as molded or pressed between dies with aluminum, titanium or other metal coated on the particles per se or by also providing particles of the same or a different metal in a homogeneous mixture the diamond particles and compacting the mixture between dies while heat is applied thereto to weld the mixture into a solid shape.

What is claimed is:

1. A washer adapted to be compressively engaged between work surfaces comprising:
    a) a washer base of circular configuration fabricated of a solid material having a central opening permitting the washer to be assembled with and surrounded by a shank or the like and to be compressed between two adjacent parallel surfaces of work in an assembly with such work,
    b) the entire outer surface of said washer base being coated with a synthetic diamond-like material which serves to protect the washer from corrosion.

2. A washer in accordance with claim I having the outer surface of said coating of said diamond-like material coated with a solid lubricant.

3. A washer in accordance with claim I having a hard surfacing material coated against the outer surface of said synthetic diamond-like material formed of a metal, alloy, carbide, nitride or oxide of a metal selected from the group of metals including chromium, vanadium, titanium, tungsten, columbium and aluminum.

4. A washer in accordance with claim 3 wherein said synthetic diamond-like coating has thickness in the range of 0.0001" to 0.005"

5. A washer in accordance with claim 1 wherein said base is shaped to define a lock washer having its entire outer surface coated with synthetic diamond material.

6. A washer in accordance with claim 1 wherein said washer base is formed of metal and has an arcuate cross sectionional shape, said base and the coating thereon being deflectable.

7. A washer in accordance with claim 1 wherein said washer base is torroidal in shape.

8. A washer in accordance with claim 1 wherein said washer base is made of metal and at least a portion thereof is deformable below its elastic limit when said washer is compressed between two surfaces to provide a sealing action.

9. A washer in accordance with claim 8 in the configuration of a tubular torroid with a circumscribing side wall defining a tubular formation which is deformable when compressed between work surfaces.

10. A washer in accordance with claim 1 wherein said washer base has a rectangular cross section, the top and bottom faces of said washer being flat and parallel to each other.

11. A washer in accordance with claim 1 in the configuration of a split ring with the portions of said ring adjacent the separation therebetween being displaced axially from each other, said split ring being axially deflectable when compressed between work surfaces without being permanently deformed to permit the washer to serve as a lock washer.

12. A washer in accordance with claim 1 wherein said washer base is solid through and through, said base and the coating thereon being shaped to permit at least a portion thereof to be compressively deflected below their elastic limits when forcibly engaged between work surfaces.

13. A washer in accordance with claim 3 wherein said synthetic diamond-like coating and the coating formed of said hard surfaceing material have a total thickness in the range of 0.0001" to 0.005".

14. A fastening device for use as a component in a manufactured assembly comprising:
    a) a core member made of a rigid solid structural material having opposed first and second facial portions at least one of which is adapted to be compressively engaged against an assembly component when assembled with said component,
    b) a passageway formed on said core member and extending between said first and second facial portions of said base,
    c) the inside wall of said passageway being coated with a synthetic diamond-like material.

15. A fastening device in accordance with claim 14 having the entire outer surface of said base coated with said synthetic diamond-like material.

16. A fastening device in accordance with claim 15 wherein the inside wall of said passageway is threaded to receive a threaded shank and is entirely coated with synthetic diamond.

17. A fastening device in accordance with claim 16 in the configuration of a nut.

18. A fastening device in accordance with claim 17 wherein the threads of the threaded portion of said inside wall of said passageway are shaped and configured with said synthetic diamond coating to provide a locking action with an threaded shank assembled therewith.

* * * * *